(12) United States Patent  
Corisis (10) Patent No.: US 7,511,364 B2
(45) Date of Patent: Mar. 31, 2009

(54) FLOATING LEAD FINGER ON A LEAD FRAME, LEAD FRAME STRIP, AND LEAD FRAME ASSEMBLY INCLUDING SAME

(75) Inventor: David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,775

(22) Filed: Aug. 31, 2004

(65) Prior Publication Data

US 2006/0043542 A1 Mar. 2, 2006

(51) Int. Cl.
*H01L 23/495* (2006.01)

(52) U.S. Cl. .................... 257/676; 257/666; 257/672

(58) Field of Classification Search .............. 257/666, 257/692, 669–672, 691, 676, 784, 786, E23.031, 257/E23.042, E23.043, E23.07

See application file for complete search history.

(56) References Cited

U.S. PATENT DOCUMENTS

| | | | |
|---|---|---|---|
| 4,862,245 A | 8/1989 | Pashby et al. | |
| 5,162,894 A | 11/1992 | Asano et al. | |
| 5,286,679 A | 2/1994 | Farnworth et al. | |
| 5,812,381 A | 9/1998 | Shigeta et al. | |
| 5,837,368 A * | 11/1998 | Hiroe et al. ................. | 428/343 |
| 5,869,355 A | 2/1999 | Fukaya | |
| 5,869,898 A | 2/1999 | Sato | |
| 5,955,777 A | 9/1999 | Corisis et al. | |
| 6,104,083 A | 8/2000 | Ito | |
| 6,133,623 A * | 10/2000 | Otsuki et al. ................ | 257/666 |
| 6,159,764 A | 12/2000 | Kinsman et al. | |
| 6,248,611 B1 | 6/2001 | Grigg et al. | |
| 6,265,762 B1 | 7/2001 | Tanaka et al. | |
| 6,277,673 B1 | 8/2001 | Corisis | |
| 6,433,418 B1 * | 8/2002 | Fujisawa et al. ............ | 257/696 |
| 6,458,617 B1 | 10/2002 | Liao et al. | |
| 6,482,674 B1 | 11/2002 | Kinsman | |
| 6,518,650 B2 | 2/2003 | Corisis et al. | |
| 6,552,420 B1 | 4/2003 | Corisis | |
| 6,566,738 B2 | 5/2003 | Abedifard | |
| 6,580,158 B2 | 6/2003 | Corisis et al. | |

* cited by examiner

*Primary Examiner*—Hung Vu
(74) *Attorney, Agent, or Firm*—TraskBritt (57) ABSTRACT

A semiconductor device assembly includes a semiconductor device and a lead frame having lead fingers for connection to the semiconductor device. The lead frame may include floating no connect (NC) lead fingers with inner portions of the floating NC lead fingers electrically isolated from the semiconductor device and the associated outer portion of the floating NC lead fingers. Floating NC lead fingers may separate lead fingers prone to causing induction noise from lead fingers subject to induction effects. The floating NC lead fingers may also allow the semiconductor device to be securely adhered to the lead fingers with no air pockets therebetween. A method of forming a semiconductor device assembly is also provided.

35 Claims, 10 Drawing Sheets

FLOATING LEAD FINGER ON A LEAD FRAME, LEAD FRAME STRIP, AND LEAD FRAME ASSEMBLY INCLUDING SAME

BACKGROUND OF THE INVENTION

1. Field of the Invention

The present invention relates to semiconductor devices in general and, more particularly to a method and apparatus for reducing noise between lead fingers by providing an electrically isolated no-connect ("NC") lead in the lead frame.

2. Background of Related Art

Well known types of semiconductor devices are connected to a component known as lead frames and subsequently encapsulated in plastic for use in a wide variety of applications. The lead frame is typically formed from a single, continuous sheet of metal, typically by metal stamping or chemical etching operations. A "conventional" lead frame usually includes an outer supporting frame, a central semiconductor device support pad (paddle), and a plurality of lead fingers, each lead finger having, in turn, a terminal bonding portion near the central semiconductor device supporting pad. In the assembly of semiconductor devices utilizing such lead frames, a semiconductor device in the form of a semiconductor die, or integrated circuit (IC) is secured to the central supporting pad, a paddle (such as by a solder or epoxy die-attach, although a double-sided adhesive tape-type attach has also been suggested in the art). Some of the lead fingers carry a signal to the semiconductor device, while others provide a power source or a ground. The lead fingers are electrically connected to bond pads on the semiconductor device using fine wires, termed "bond wires." In a conventional wire bonding process, the bond wires are formed and bonded, one at a time, between each bond pad on the semiconductor device and an associated lead finger of the lead frame. After the wire bonds between the contact pads of the semiconductor device and the lead fingers are made, the semiconductor device and wire bonds are typically encapsulated in plastic using a transfer or injection molding process. Finally, the rails of the outer supporting frame of the lead frame are removed leaving portions of the lead fingers extending beyond the encapsulated semiconductor device, the lead fingers being simultaneously formed to a finished shape in a so-called "trim and form" operation.

One common variation on the foregoing arrangement is to eliminate the die support pad or paddle and adhesively attach the semiconductor device to the lead fingers of the lead frame using an alpha barrier, such as a polyimide tape, for example, KAPTON™ tape.

In such an arrangement, a so-called "leads-over-chip" arrangement (LOC), a plurality of lead fingers extend over the active surface of a semiconductor device toward one or more lines of bond pads, wherein bond wires make the electrical connection between the lead fingers and the bond pads. Examples of such LOC configurations are shown in U.S. Pat. No. 4,862,245 to Pashby and U.S. Pat. No. 5,286,679 to Farnworth et al., the latter being assigned to the assignee of the present invention.

Figure 1A:
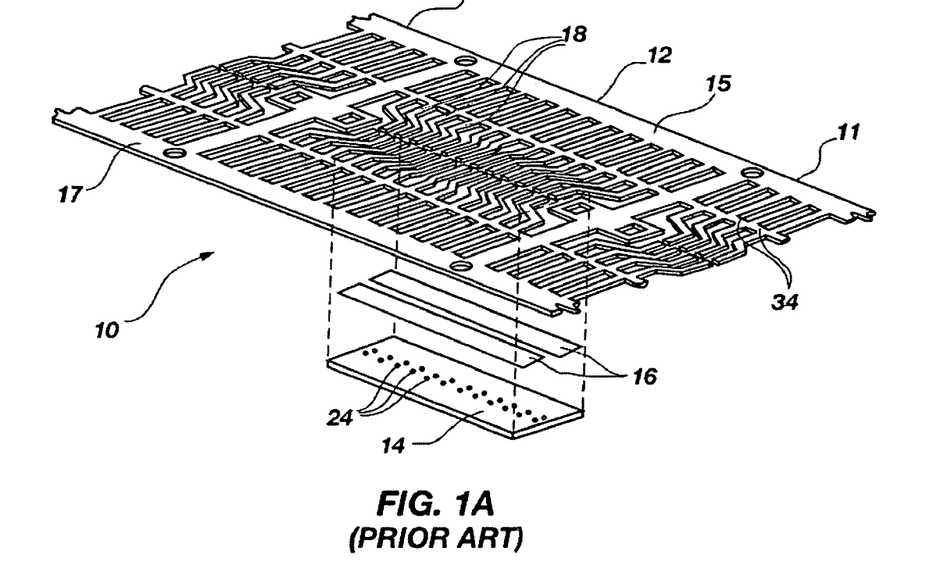
FIG. 1A is a perspective illustration of one prior art semiconductor device assembly.
Figure 1B:
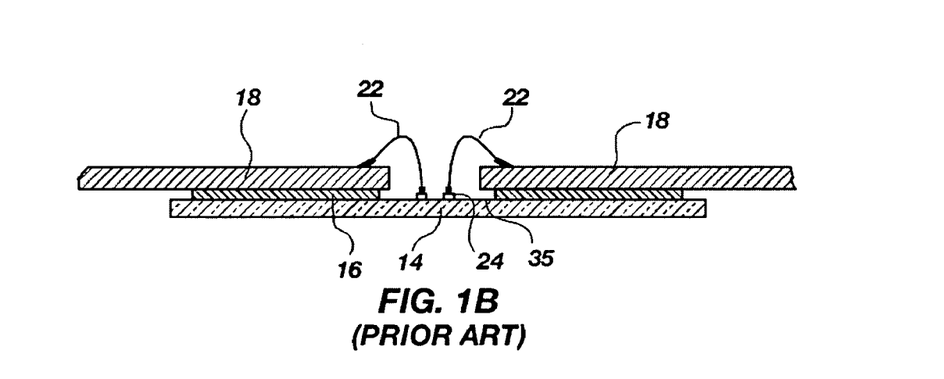
FIG. 1B is a cross-sectional depiction of portions of one prior art semiconductor device assembly with the semiconductor device and the lead frame in contact.

A semiconductor device and lead frame configuration of one prior art semiconductor device assembly 10 is illustrated in drawings FIG. 1A and FIG. 1B. As shown, the semiconductor device 14 is supported by tape 16. A lead frame 12 typically has a pattern of lead fingers 18. Conductive wires 22 connect the lead fingers 18 to the bond pads 24 on the active surface 35 of the semiconductor device 14. Following wire bonding, the semiconductor device 14 and lead frame 12 are encapsulated, typically with a polymeric or ceramic material, to form a package. The connecting segments 34 between the lead fingers 18 are cut away and trimmed to singulate each lead finger 18, the outer portion of the lead finger 18 ultimately configured as a pin for attachment to a host electronic apparatus, not shown.

The lead frame 12 is one of a plurality that is connected in end-to-end fashion, thereby forming a strip of lead frames, the plurality referred to as a lead frame strip. Lead frame 12 is positioned between a preceding frame 11 and a following frame 13. Typically, following encapsulation, the lead frames 11, 12 and following frame 13 are separated one from the other and the opposing edges or rails 15 and 17 are removed so that each frame with a semiconductor device attached thereto becomes a separate and useable semiconductor device assembly.

The leads 18 may be conventionally designated in the lead register for a memory device as power supply voltage VCC, reference voltage VSS, data input DIN, data output DOUT, write enable signal WE, row address strobe RAS, address signal A, column address strobe CAS, output enable OE, and other labels as required. The particular labels designated in the lead register may differ from manufacturer to manufacturer and differ depending upon the use to which the device is applied.

In order to lower their overall cost, semiconductor device assemblies 10 are typically made to be used in a variety of applications, and in most applications, only some of the leads 18 are used. This is particularly true of the address signal A leads. Thus, while some leads 18, such as VCC, VSS, DIN, DOUT and WE, may be used in all or nearly all applications, only some of the address signal (A) leads are typically used, leaving some leads as unused, no-connect, or "NC" leads.

The leads most prone to causing induction noise, i.e., Vcc, Vss, DIN, DOUT and WE, are conventionally located to minimize inductive interaction with the address signal A leads. The leads generally most subject to induction effects are those designated as VCC, VSS, DIN, DOUT, WE, RAS, and CAS.

As the capacity and speed of many integrated circuit devices such as dynamic random access memories (DRAMs) have increased, the number of inputs and outputs (I/Os) to each die has increased, requiring more numerous and complex external connections thereto. In some instances, this requires undesirably long lead frame lead fingers (as depicted in the lead frame 12 of FIG. 1) to place the lead ends in contact with, or in close proximity to, the bond pads serving as inputs and outputs or I/Os, for the typical die.

While lead inductance in IC packages has not traditionally been troublesome because slow signal frequencies of past devices render the effects of such inductance relatively insignificant, faster and ever-increasing signal frequencies of state-of-the-art electronic systems have substantially increased the practical significance of lead inductance. For example, at such faster signal frequencies, performance of IC dice using lead frames for external electrical connection is slower than desirable because the inductance associated with the lead fingers slows changes in signal currents through the leads, prolonging signal propagation through the leads. Further, digital signals propagating along the lead fingers are dispersing or "spreading out," because the so-called "Fourier" components of various frequencies making up the digital signals propagate through the inductance associated with the lead fingers at different speeds, causing the signal components, and thus the signals themselves, to disperse along the lead fingers. While mild dispersion merely widens the digital signals without detrimental effect, severe dispersion can make the digital signals unrecognizable upon receipt. In addition, so-called "reflection" signals propagating along the lead fingers as a result of impedance mismatches between the lead fingers and associated IC die or between the lead fingers and external circuitry, caused in part by lead-associated inductance, can distort normal signals propagating along the lead fingers concurrently with the reflection signals. Further, magnetic fields created by signal currents propagating through the lead-associated inductance can induce currents in adjacent lead fingers, causing so-called "crosstalk" noise on the latter. While these various effects might be troublesome in any electronic system, the aforementioned trend toward lower voltage systems (currently 3.3 volts) and away from the traditional 5.0 volt systems increases their visibility and significance.

At state-of-the art operational speeds, signal propagation delays, switching noise, and crosstalk between signal conductors resulting from mutual inductance and self inductance phenomena of the conductive paths all become significant to signal degradation. Mutual inductance results from an interaction between magnetic fields created by signal currents flowing to and from a lead frame-mounted, packaged IC die through the leads or "lead fingers," while self inductance results from the interaction of the foregoing fields with magnetic fields created by oppositely-directed currents flowing to and from ground.

Certain currently-popular die and package configurations serve to exacerbate the noise problems by favoring use of a large plurality of laterally adjacent lead fingers of substantial length. For example, the aforementioned LOC configurations typically place the bond pads of a die in one or two rows extending along the central, longitudinal axis of the die. To accommodate the centralized bond pad location for wire-bonding and at the same time eliminate the need for a conventional die-attach paddle as a physical die support, LOC lead frames have been developed that employ lead fingers extending from the sides of the die and over the active surface into close proximity with the bond pad row or rows.

While a mechanically desirable packaging concept, the LOC-type long, mutually parallel lead finger runs over the active surface becoming abusive in terms of unacceptably increasing real impedance as well as lead inductance (both self and mutual) in the circuit. These lead finger runs also increase signal reflection in the circuit due to transmission line effects and degrade signal integrity due to the aforementioned propagation delays, switching noise, and crosstalk.

LOC configurations are merely one example of the type of packaging promoting the above-referenced undesirable noise phenomena. However, the same undesirable characteristics may be experienced with other lead frame configurations employing extended lead fingers, particularly large groups of such lead fingers in close mutual proximity. Such configurations include a lead frame with a paddle, lead-under-chip (LUC) configurations, and configurations wherein a large number of leads extend from several sides of a semiconductor die to a single side or edge of a package, such as in a vertical surface mount package, or VSMP.

Figure 2:
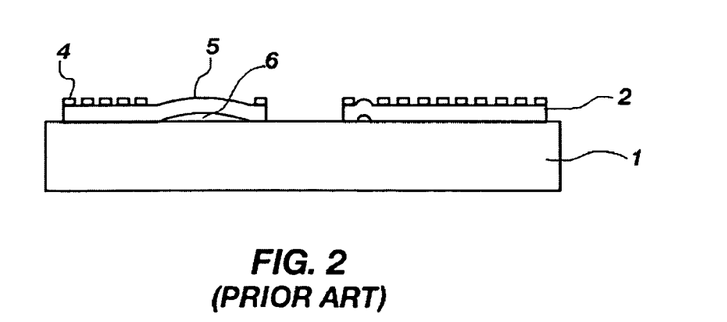
FIG. 2 is a cross-sectional view of a conventional LOC semiconductor device.

Packages have previously been configured in an attempt to reduce package noise of the type described above. For example, the primary factors affecting crosstalk include the surface area of the signal line directed to an adjacent signal line, the signal line length being a factor of the surface area, the distance between the signal lines and the dielectric constant ($\epsilon_r$) of the material between the signal lines. Therefore, increasing the distance between the signal lines, or lead fingers is one way to reduce crosstalk. As illustrated in FIG. 2, if spaces 5 are permitted between adjacent lead fingers in an arrangement where the lead fingers 4 are adhered to the active surface of a semiconductor die 1, the application pressure applied on the tape 2 decreases substantially in the spaces 5 with the result that the tape 2 peels off from the semiconductor die 1 along the spaces 5 during the die attach step. The peeling off of the tape 2 makes the lead fingers 4 unstable on the surface of the semiconductor die 1, and may degrade the reliability of the semiconductor die 1. The gap 6 formed between the tape 2 and semiconductor die 1 may develop a trapped air pocket in the subsequent molding of the package body. The trapped air pockets may cause crack propagation and delamination of the package body.

The peeling off of the adhesive tape may be prevented by providing a no-connect lead finger (NC lead). This no-connect lead finger is not required for a connection, but extends into the package body like adjacent leads. The NC lead adds an additional solder connection for strengthening package attachment to a printed circuit board, however voltages are often routed through the pad on the printed circuit board to which the NC lead is soldered. The NC lead, as a consequence, becomes charged and can itself become a source of noise for adjacent leads.

Accordingly, the inventor has recognized the need for a low-cost, reduced-inductance circuit configuration adaptable to current packaging designs and employing conventional and readily available materials, equipment and fabrication techniques.

BRIEF SUMMARY OF THE INVENTION

The present invention, in a number of exemplary embodiments, includes semiconductor device assemblies having floating lead fingers and methods of fabricating semiconductor device assemblies, as well as a method for reducing inductance associated with the lead fingers of a lead frame in a semiconductor device assembly. By using the floating lead fingers on the present invention in a "leads-over-chip" (LOC) arrangement, the lead fingers of a lead frame may be adhered to the surface of a semiconductor device or die with increased stability.

In accordance with one aspect of the present invention, a semiconductor device assembly includes a semiconductor device having bond pads on an active surface thereof and a lead frame having a plurality of lead fingers extending inwardly over the active surface. The lead fingers may be joined together laterally and stabilized by interposed connecting segments. At least one lead finger may be a floating lead finger, also termed a no-connect, or NC lead, not configured to be connected to any of the bond pads on the semiconductor device. The inner portion of the floating lead finger may be severed from electrical connection with the outer portion of the floating lead finger, for example, by cutting or etching through the material of the lead finger at a point just inside the connecting segment.

The inner portion of the floating lead finger may include multiple proximal lead elements and an associated distal intersection. In another embodiment of the present invention, there may be multiple inner portions of the floating lead finger for an associated single outer portion of the floating lead finger. In yet another embodiment of the present invention, the inner portion of the floating lead finger may extend inwardly from a peripheral edge of the semiconductor device to beyond the center of the semiconductor device.

A lead frame with a die paddle supporting the semiconductor device and lead fingers adjacent to the semiconductor device may include a floating lead finger. The inner portions of the lead fingers may be held in relative position to one another with a lead-lock tape. The inner portion of the floating lead finger may be severed from electrical connection with the outer portion of the floating lead finger. The floating lead finger may be useful for isolation and the reduction of noise in this lead frame configuration.

One embodiment of a method for reducing inductance according to the present invention includes providing a lead frame having lead fingers extending toward the center of the frame. A designated NC lead finger may be located between two other lead fingers where the signal of one can interfere with the signal of the other. The outer portion of the NC lead finger may be electrically isolated from the associated inner portion by excising a region of the NC lead finger.

Other features and advantages of the present invention will become apparent to those of skill in the art through consideration of the ensuing description, the accompanying drawings, and the appended claims.

DETAILED DESCRIPTION OF THE INVENTION

Figure 3A:
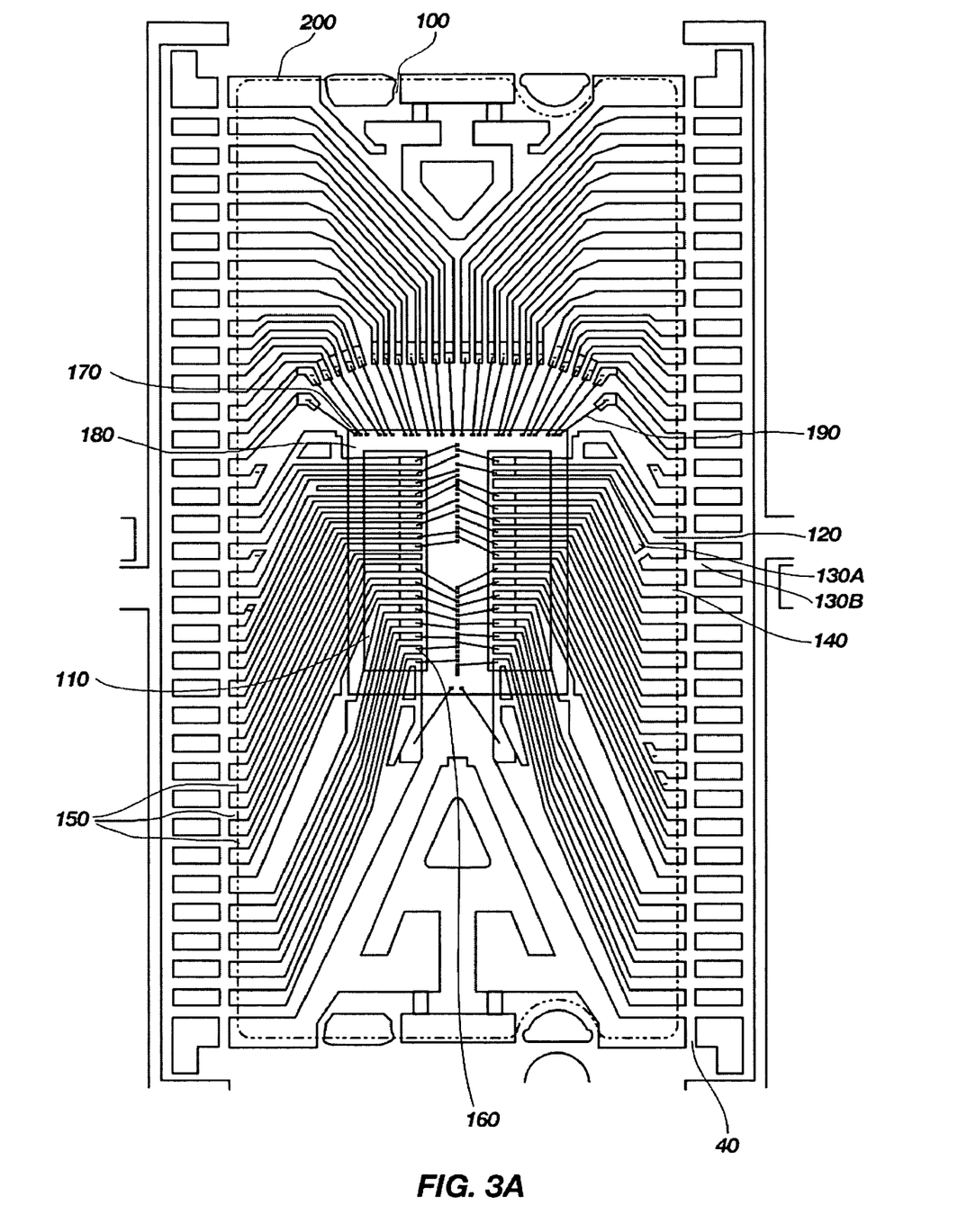
FIG. 3A is a plan view of a semiconductor device and attached lead frame of one embodiment of the invention.

One exemplary embodiment of a semiconductor device attached to a lead frame according to the present invention is depicted in FIG. 3A. An LOC (lead-over-chip) lead frame 100 couples a plurality of bond pads 170 of a semiconductor device 180 to pins, or I/Os of a semiconductor package. The lead frame 100 comprises a plurality of conductive lead fingers 150 that extend toward the center of the lead frame 100. Each of the conductive lead fingers 150 includes a proximal end 160 electrically connected to the semiconductor device 180. Due to the narrow spacing or pitch of the conductive lead fingers 150, the proximal wire bond areas typically comprise unenlarged proximal ends 160 for most of the conductive lead fingers 150.

The conductive lead fingers 150 may be formed of any suitable material, such as copper, aluminum, alloy or any other suitable conductive material for lead frames as known to those of ordinary skill in the art. While the lead frame 100 is, in this case, configured for a lead-over-chip package, the use of other lead frame configurations employing extended lead fingers, such as a lead frame with a die paddle, lead-under-chip (LUC) configurations, and configurations wherein a large number of leads extend from several sides of a semiconductor die to a single side or edge of a package, such as in a vertical surface mount package or VSMP, are also within the scope of the invention.

The semiconductor device 180 may comprise any conventional type of semiconductor device, such as a Dynamic Random Access Memory (DRAM) die, a Static Random Access Memory (SRAM) die, a Synchronous DRAM (SDRAM) die, a Sequential Graphics Random Access Memory (SGRAM) die, a flash Electrically Erasable Programmable Read-Only Memory (EEPROM) die, a logic die, and/or a processor die.

The bond pads 170 on the active surface of the semiconductor device 180 are electrically connected to the lead fingers 150 of the lead frame 100 by discrete conductive elements 190, for example, wire bonds, to pass signals between the integrated circuitry of the semiconductor device 180 and external circuitry (not shown), such as conductive traces on a carrier substrate (i.e., a printed circuit board), other devices carried on and electrically connected to the carrier substrate, and other conductors and active and passive components packaged at the same or at a higher level. It should be understood, however, that the present invention is not limited to wire-bonded connections, and that device assemblies using direct thermocompression bonding of lead fingers to bond pads, or using flex-circuit type connections between bond pads and lead fingers using conductors in a preformed pattern carried on a thin dielectric (termed "TAB" connections, for tape automated bonding), may also benefit from the present invention.

The semiconductor device may be covered in a molding process with a package that is formed from a transfer molded, silicon particle-filled resin or the like. The outline of the package body is generally indicated by a dashed line 200. The conductive lead fingers 150 are joined together and stabilized by connecting segments 40. Following the molding process, the connecting segments 40 between the conductive lead fingers 150 will be severed, such that each conductive lead finger 150 forms a separate conductive path through the package to the semiconductor device 180.

Inner portions of the conductive lead fingers 150 are adhered onto the surface of the semiconductor device 180 with use of tape strips or segments 110. In the alternative, the semiconductor device 180 may be supported on the conductive lead fingers 150 by a single piece of tape, the LOC configuration as shown may be modified, or a lead-under-chip (LUC) structure may be used. The tape strips 110 may be formed from any suitable well known type dielectric film. One suitable type tape includes KAPTON™ tape, which may be adhesively coated on both sides thereof. Conductive lead fingers 150 may also be adhered to the semiconductor device 180 using, for example, a dielectric liquid or gel adhesive. The tape strips 110 may additionally function to electrically insulate the active surface of the semiconductor device 180 from the conductive lead fingers 150.

At least two of the conductive lead fingers 150 represent any two conductive lead fingers where the signal of one can interfere with the signal of the other. A noisy lead finger 120 typically may be one most prone to causing induction noise, i.e., Vcc, Vss, DIN, DOUT, UQDS, and WE, and a sensitive lead finger 140 generally may be one most subject to induction effects, i.e., Vcc, Vss, VREF, DIN, DOUT, WE, RAS, and CAS. A floating lead finger may be located between a noisy lead finger 120 and a sensitive lead finger 140 to minimize inductive interaction.

The floating lead finger is a no-connect lead (NC), not configured to be connected to any of the bond pads on the semiconductor device. A floating lead finger inner portion 130A is severed from electrical connection with an associated floating lead finger outer portion 130B, for example, at a point just inside connecting segment 40 and the periphery of the package body, generally indicated by the dashed line 200. Thus, the floating lead finger inner portion 130A is electrically isolated and may provide isolation for the sensitive lead finger 140 from the noisy lead finger 120.

Figure 9:
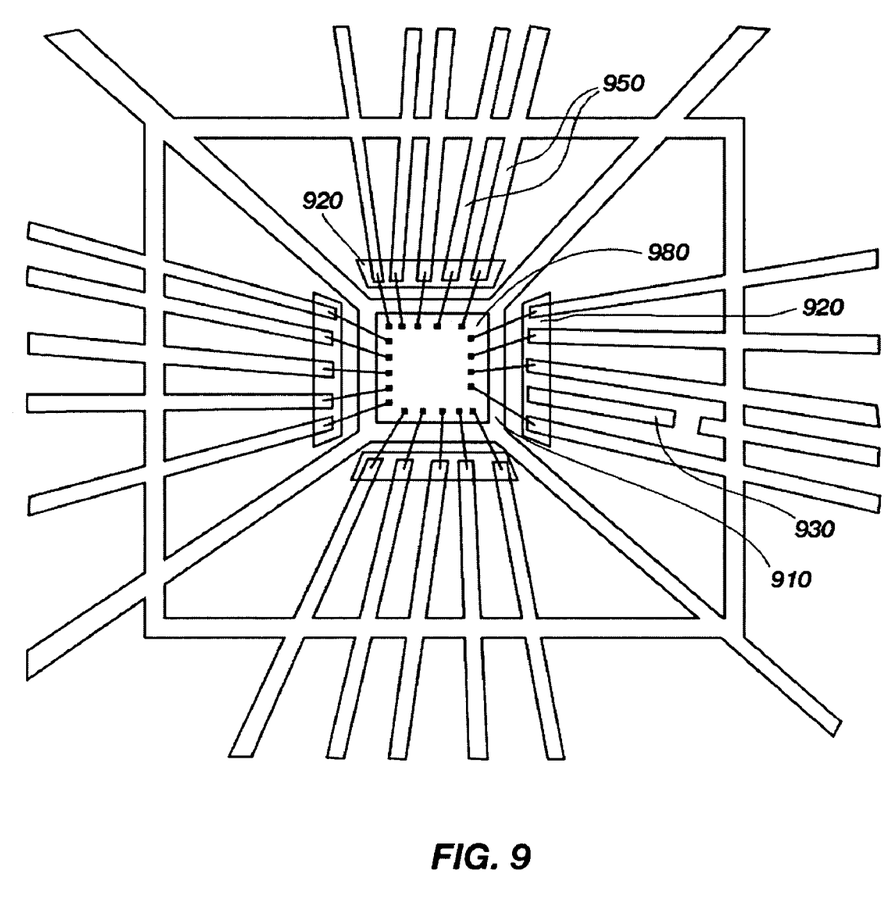
FIG. 9 is a plan view of a lead frame of a seventh embodiment of the invention.

The floating lead finger is one method of increasing the distance between two lead fingers to provide isolation. Merely spacing two lead fingers greater than, for example, 0.38 mm apart in an LOC configuration to provide isolation may result in peeling off of the tape strips 110 adhering the lead fingers 150 onto the surface of the semiconductor device 180. However, as shown in FIG. 9, a floating lead finger 930 of the present invention may additionally be useful when a semiconductor device 980 is supported by a die paddle 910 and the lead fingers 950 are adjacent to the semiconductor device 980. A lead-lock tape 920 may be put over the lead fingers 950, not to support the semiconductor device in a LOC configuration, but to stabilize and hold the lead fingers 950 in relative position to one another during the manufacturing process prior to forming the package body. Peeling off of the tape may not be a problem with lead-lock tape 920, but a floating lead finger 930 may be useful for isolation and the reduction of noise in this lead frame configuration. The present invention thus provides isolation between two lead fingers in a conventionally designed lead frame.

Therefore, although the conductive lead fingers 150 of the LOC lead frame 100 are shown in FIG. 3A having a particular shape and a particular arrangement with respect to one another, the present invention includes within its scope lead frame leads having any shape and any arrangement. In addition, while only one floating lead finger is shown in FIG. 3A, the present invention includes within its scope lead frames with any number of floating lead fingers.

Figure 3B:
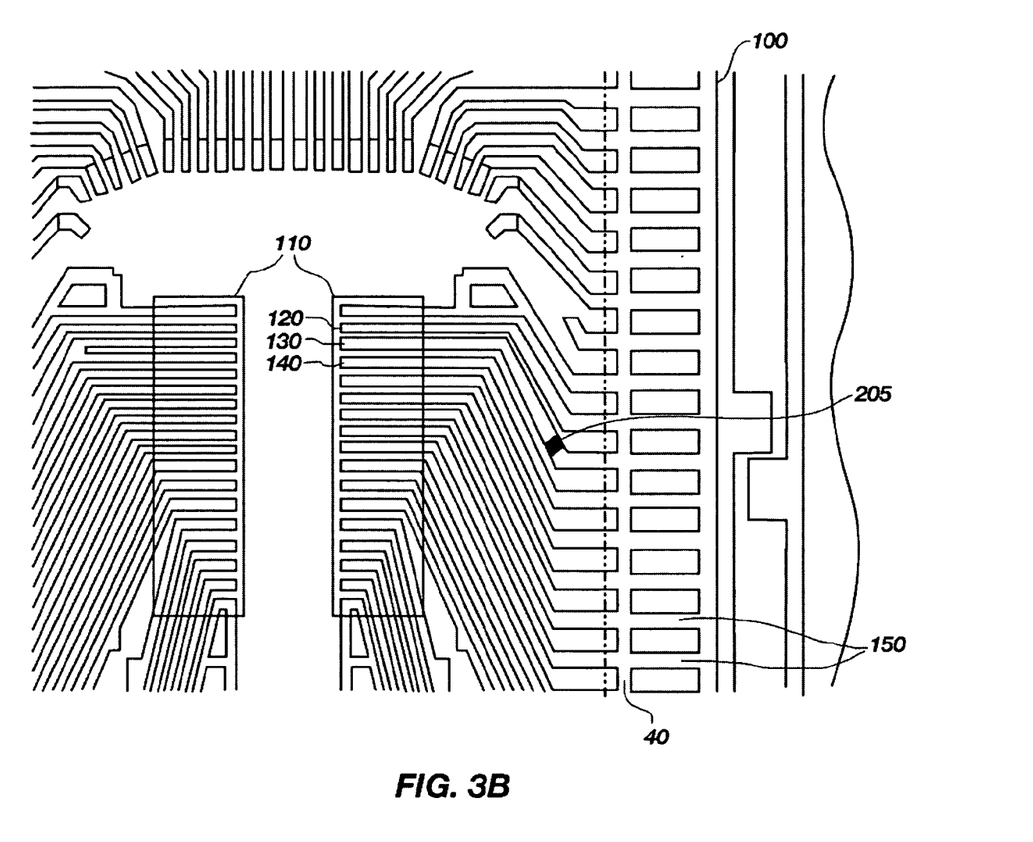
FIGS. 3B-3C are partial plan representations depicting fabrication of the lead frame illustrated in FIG. 3A.
Figure 3C:
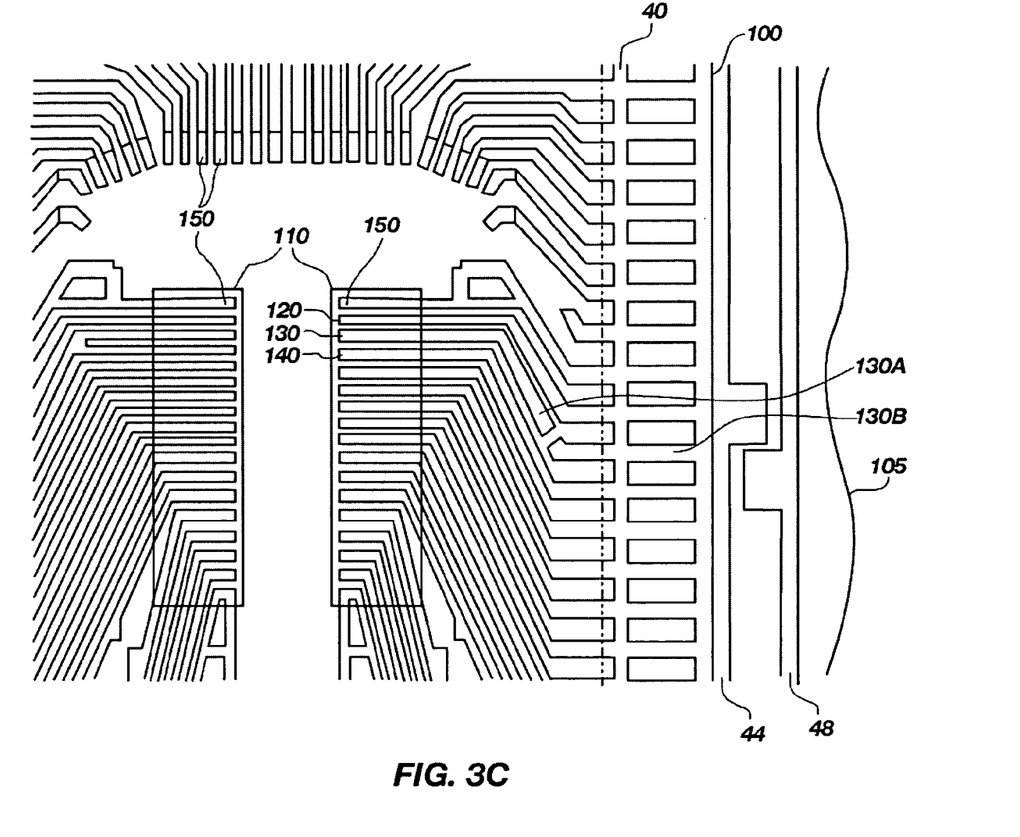

Turning now to FIGS. 3B-3C, an exemplary method for fabricating the lead frame 100 is illustrated.

FIG. 3B depicts a partial section of the lead frame 100 at a stage in fabrication prior to electrically isolating a floating lead finger inner portion and a floating lead finger outer portion. The lead frame 100 having a plurality of inwardly extending conductive lead fingers 150 is provided. Connecting segments 40 are provided to laterally join together and stabilize the conductive lead fingers 150. As shown, tape strips 110 are pre-applied to conductive lead fingers 150. A semiconductor device may subsequently be attached to the tape strips 110. Adhesives, for example, thermosetting adhesives or contact adhesives may be used to attach the conductive lead fingers 150 to the tape strips 110 and the semiconductor. In the alternative, one or more adhesive layers, for example, thermoplastic layers, are applied to each side of the tape strips 110, which may subsequently be used to support the semiconductor device. It should also be appreciated that the present invention contemplates the use of other lead frame configurations to attach the semiconductor device, such as a lead frame with a paddle and lead-under-chip (LUC) configurations.

At least one conductive lead finger is designated as a floating lead finger 130, located between a conductive lead finger designated as the noisy lead finger 120 and one designated as the sensitive lead finger 140. Prior to encapsulation, the floating lead finger may be severed by excising a region of the floating lead finger 130 to form individual, electrically isolated floating lead finger inner portion 130A and associated electrically isolated floating lead finger outer portion 130B (FIG. 3C). Each floating lead finger inner portion 130A is a NC lead as shown in FIG. 3A. The region of the floating lead finger 130 to be excised, a severance region 205, is shaded in FIG. 3B. For example, this excising step may take place by various processes, such as saw cutting, scribing, scoring, punching, etching, or the use of a laser beam to disconnect the floating lead finger inner portion 130A. In a currently preferred embodiment of the invention, the excising of the severance region 205 may take place after the application of the tape and prior to the attaching of the semiconductor device.

Figure 7:
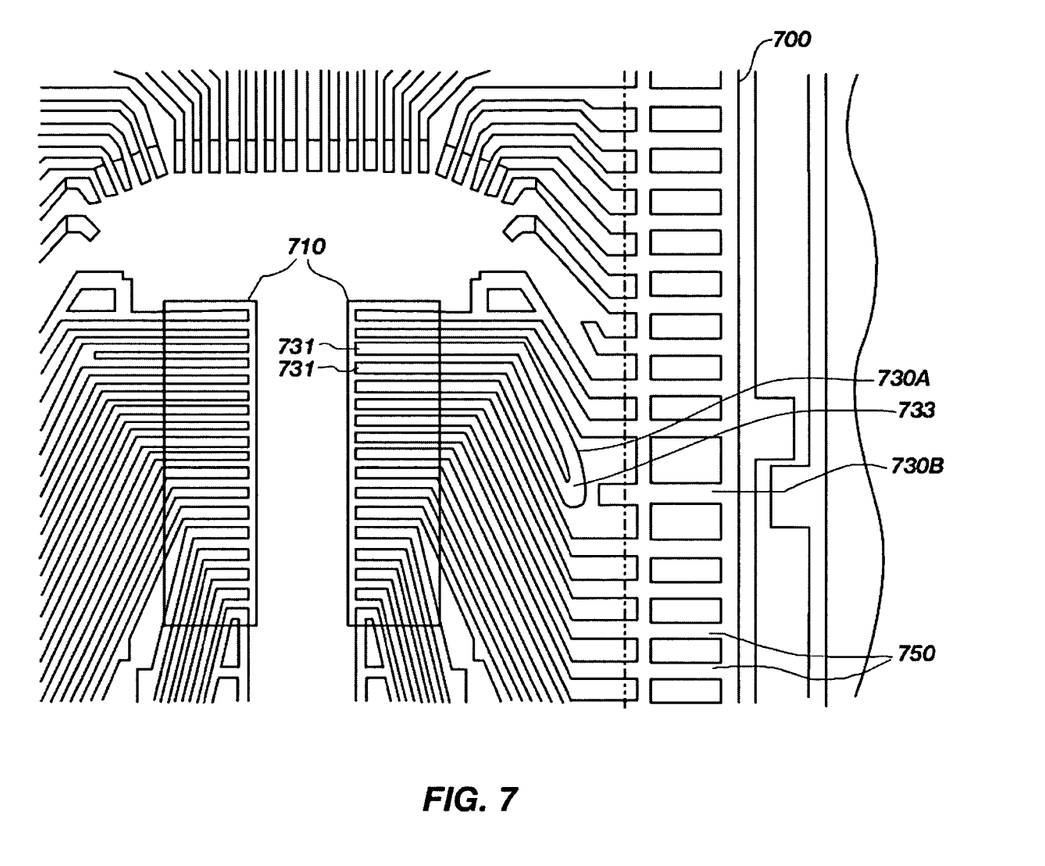
FIG. 7 is a plan view of a lead frame of a fifth embodiment of the invention.
Figure 8:
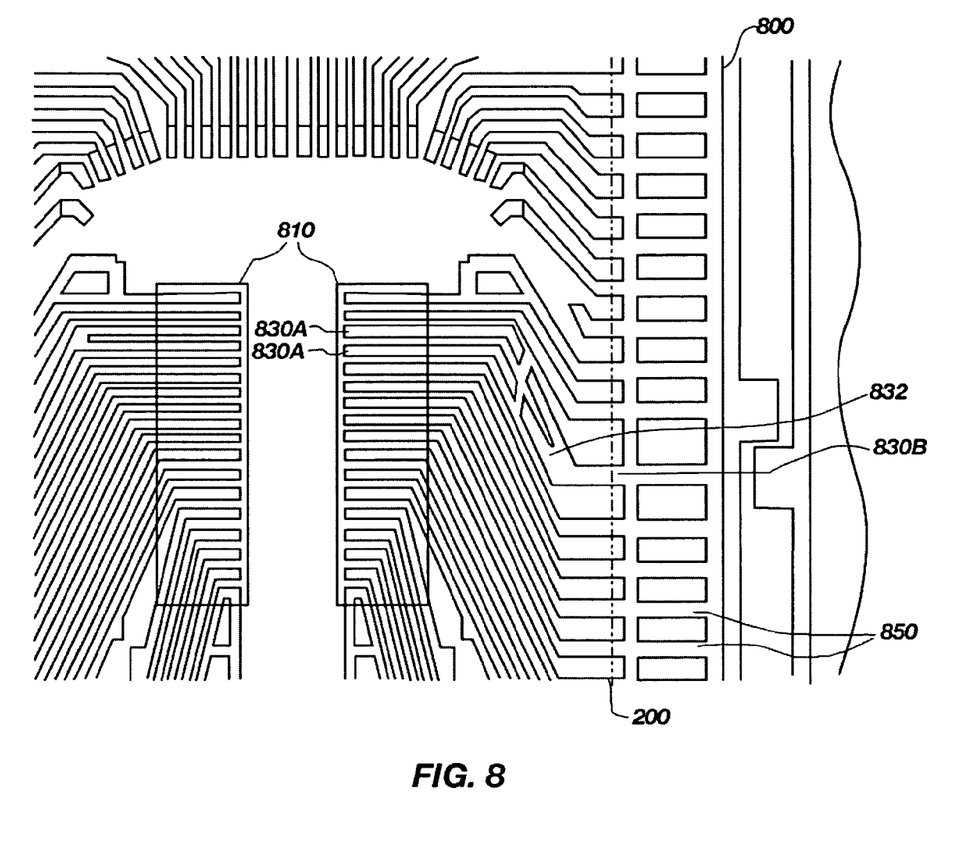
FIG. 8 is a plan view of a lead frame of a sixth embodiment of the invention.

The floating lead finger inner portion 130A may allow a sufficient lateral space to be formed between the noisy and sensitive lead fingers 120 and 140, respectively, preventing deterioration of the electrical characteristics of the packaged device, while also preventing the tape strips 110 from peeling off from the semiconductor device surface. The arrangement of the conductive lead fingers may provide a designated floating lead finger inner portion 130A having a greater or lesser width dimension than adjacent conductive lead fingers 150. Alternatively, as depicted in FIG. 7, the designated floating lead finger may have a floating lead finger inner portion 730A having a plurality of proximal lead elements 731 and an associated distal intersection 733. This floating lead finger additionally includes associated outer portion 730B. In another embodiment, as depicted by FIG. 8, the designated floating lead finger may have a plurality of floating lead finger inner portions 830A. The floating lead finger outer portion 830B of this embodiment includes an intersection 832 associated with the plurality of floating lead finger inner portions 830A. Thus the excising step may include excising the floating lead finger in a plurality of locations. It should also be appreciated that the present invention additionally contemplates a method for fabricating a lead frame including severing a plurality of floating lead fingers.

The lead frame 100 depicted in FIG. 3C may be part of a lead frame strip comprised of a plurality of lead frames extending from broken edges 105 and repeated about the slits 44 and 48. Following attachment and electrical connection of a semiconductor device, and a molding process, the lead frame strip may be severed through slits 44 and 48 to form a plurality of separate lead frames 100.

Figure 4:
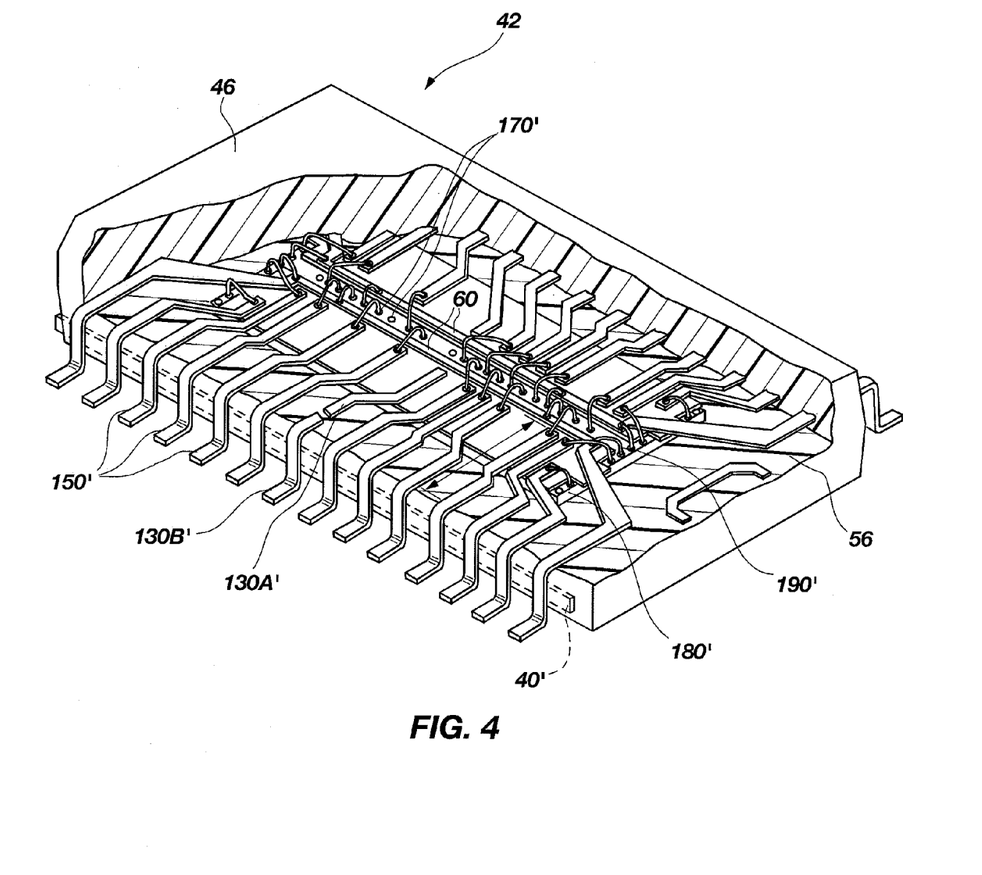
FIG. 4 is a schematic representation of a second embodiment of the present invention showing a wire bonded, encapsulated LOC semiconductor device; part of the encapsulation material has been broken away to expose the lead fingers, the semiconductor device, the bond pads of the semiconductor device, and the discrete conductive elements used to connect the lead fingers and the bond pads.

FIG. 4 shows a second embodiment of the invention, a semiconductor device package 42 including a plastic package body 56 completely encapsulating the semiconductor device 180', discrete conductive elements 190', and portions of conductive lead fingers 150'. The semiconductor device package 42 is shown with part of the encapsulating material 46 removed. Following formation of the plastic package body 56, the terminal portions of conductive lead fingers 150', which extend beyond the semiconductor device package 42, may be shaped in a desired configuration (e.g., J-bend, gull wing, butt joint, etc.) using a conventional trim and form process. After encapsulation, the connecting segments are removed. The removed connecting segments are partially shown in phantom at 40'.

The lead frame of this second embodiment employs bus bars 60 that traverse the length of the semiconductor device 180'. Multiple connections may be made from the bus bars 60 to a plurality of bond pads 170' on the active surface of the semiconductor device 180'. The semiconductor device 180' may comprise any suitable type semiconductor device, such as a Dynamic Random Access Memory (DRAM) die, a Static Random Access Memory (SRAM) die, Synchronous DRAM (SDRAM) dice, a Sequential Graphics Random Access Memory (SGRAM) die, a flash Electrically Erasable Programmable Read-Only Memory (EEPROM) die, a logic die, and/or a processor die.

The bond pads 170' of the active surface of the semiconductor device 180' additionally provide points of electrical attachment for discrete conductive elements 190' extending from a plurality of conductive lead fingers 150'. A reduced number of conductive lead fingers 150' is shown for clarity, but is not intended to be limiting of the invention. Discrete conductive elements 190' may comprise wire bonds. It should be understood, however, that the present invention is not limited to wire-bonded connections, and that device assemblies using direct thermocompression bonding of lead fingers to bond pads, or using flex-circuit type connections between bond pads and lead fingers using conductors in a preformed pattern carried on a thin dielectric (termed "TAB" connections, for tape automated bonding), may also benefit from the present invention.

One NC lead, not connected to any of the bond pads on the semiconductor device, is a floating lead finger. The floating lead finger inner portion 130A' is severed from electrical connection with the floating lead finger outer portion 130B' for example, at a point just inside the plastic package body 56.

The floating lead finger inner portion 130A' may have a greater or lesser width dimension than adjacent conductive lead fingers. It should also be appreciated that the present invention contemplates a floating lead finger inner portion having a plurality of proximal lead elements and an associated outer portion. Alternatively, the floating lead finger may have a plurality of floating lead finger inner portions and a single associated floating lead finger outer portion. In addition, it will be understood that while only one floating lead finger 130A' is shown, the present invention includes within its scope lead frames having any number of floating lead fingers.

Also, although the conductive lead fingers 150' of the lead frame are shown in FIG. 4 having a particular shape and a particular arrangement with respect to one another, the present invention includes within its scope lead frame leads and other support members having any shape and any arrangement facilitating a semiconductor device in adhesive attachment therewith.

Figure 5:
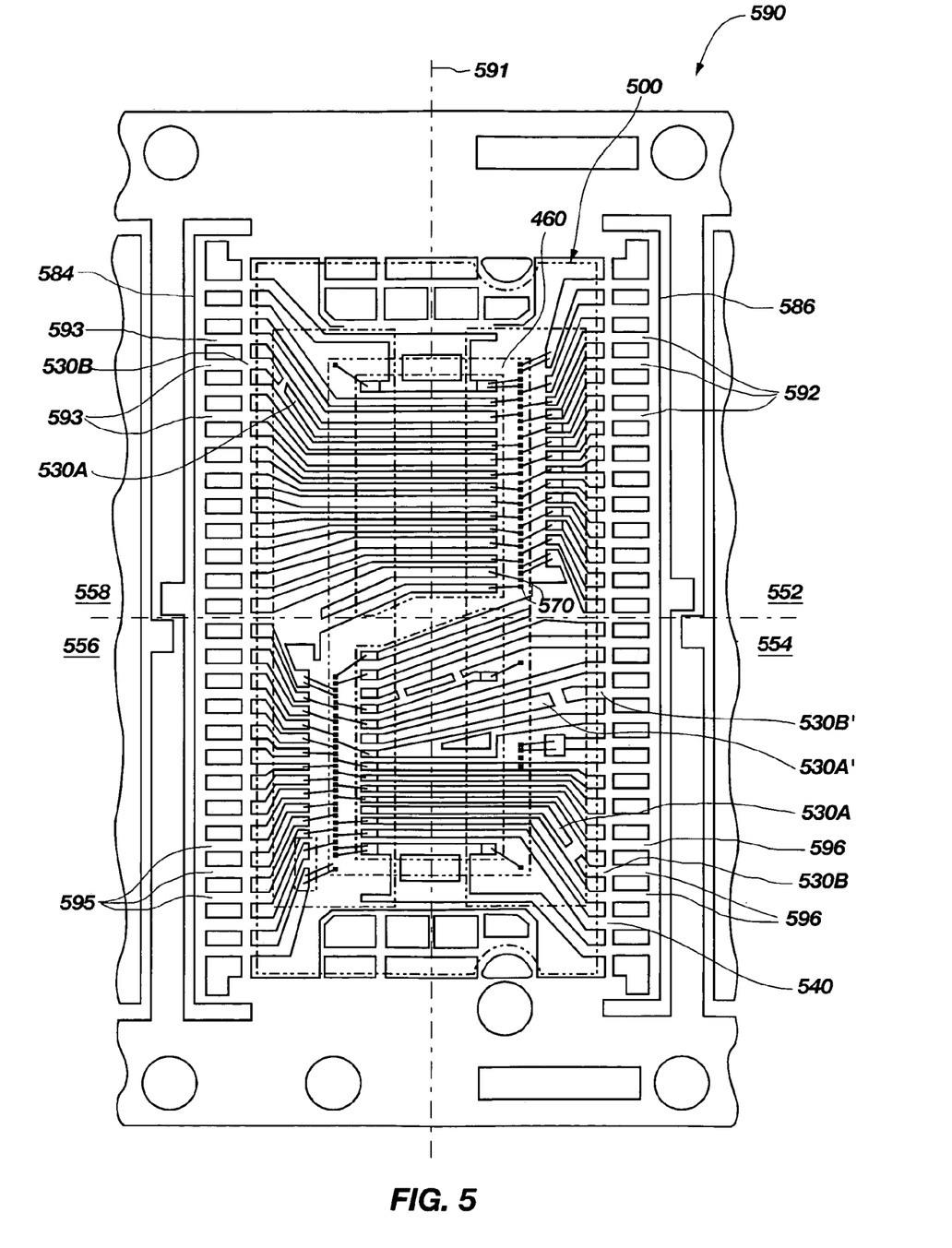
FIG. 5 is a plan view of a semiconductor device and attached lead frame of a third embodiment of the invention.

FIG. 5 is an assembly detail drawing of another embodiment of the invention, showing attachment of a semiconductor device 460 to an LOC lead frame 590 having another arrangement of lead fingers. The LOC lead frame 590 is adapted for coupling bond pads 570 of semiconductor device 460 to the interconnect pins of a memory package. Accordingly, the LOC lead frame 590 lead fingers correspond to the interconnect pins of the memory package.

A first plurality of lead fingers includes short leads, such as lead 592, extending from side 586 of the LOC lead frame 590 and originating in a first quadrant 552. The term "short" as used herein does not directly relate to physical length. As used herein, a lead finger is short if it terminates between a centerline 591 of the LOC lead frame 590 and the side from which it extends. Stated alternatively, a lead finger is short if it terminates in the same quadrant from which it originates. A second plurality of lead fingers includes long leads, such as leads 593, extending from side 584 of the LOC lead frame 590 and originating in a fourth quadrant 558. The term "long" as used herein does not directly relate to physical length. As used herein, a lead finger is long if it terminates between the centerline 591 of the LOC lead frame 590 and the side opposite from which it extends. Stated alternatively, a lead finger is long if it terminates in a quadrant other than the quadrant from which it originates.

A third plurality of leads includes short leads, such as leads 595, extending from the side 584 of the LOC lead frame 590 and originating in the third quadrant 556. A fourth plurality of leads includes long leads, such as leads 596, extending from the side 586 of the LOC lead frame 590 and originating in the second quadrant 554. Leads of the pluralities of leads may correspond to clock and control signal pins, ground pins, bias pins, as well as power input pins.

As shown in the embodiment of FIG. 5, most of the bond pads, including all of the address bond pads and the data bond pads, are arranged in two rows. Each of the two rows of chip bond pads is arranged within a peripheral region of the semiconductor device 460 and extends from a corner of the semiconductor device 460 toward a center of its associated side. Although the rows of bond pads in the embodiment of FIG. 5 are substantially in-line, a row of bond pads may contain bond pads in a staggered relationship. One of the rows of bond pads may extend toward and beyond the center of its associated side such as to be located in more than one quadrant.

FIG. 5 depicts three NC leads, not configured to be connected to any of the bond pads on the semiconductor device, as floating lead fingers. The floating lead finger inner portion 530A, 530A' is severed from electrical connection with the floating lead finger outer portion 530B, 530B', for example, at a point just inside connecting segment 540 and the package body, generally indicated by a dashed line 500.

Floating lead fingers are preferably located between long leads, those more susceptible to the effects of inductance. Semiconductor device 460 may include unused bond pads, or each bond pad may be electrically connected to a conductive lead finger.

As shown, floating lead finger inner portions 530A extend substantially perpendicularly to the peripheral edge of the semiconductor device 460. Another floating lead finger inner portion 530A' angles across the semiconductor device 460 from its associated floating lead finger outer portion 530B'.

Figure 6:
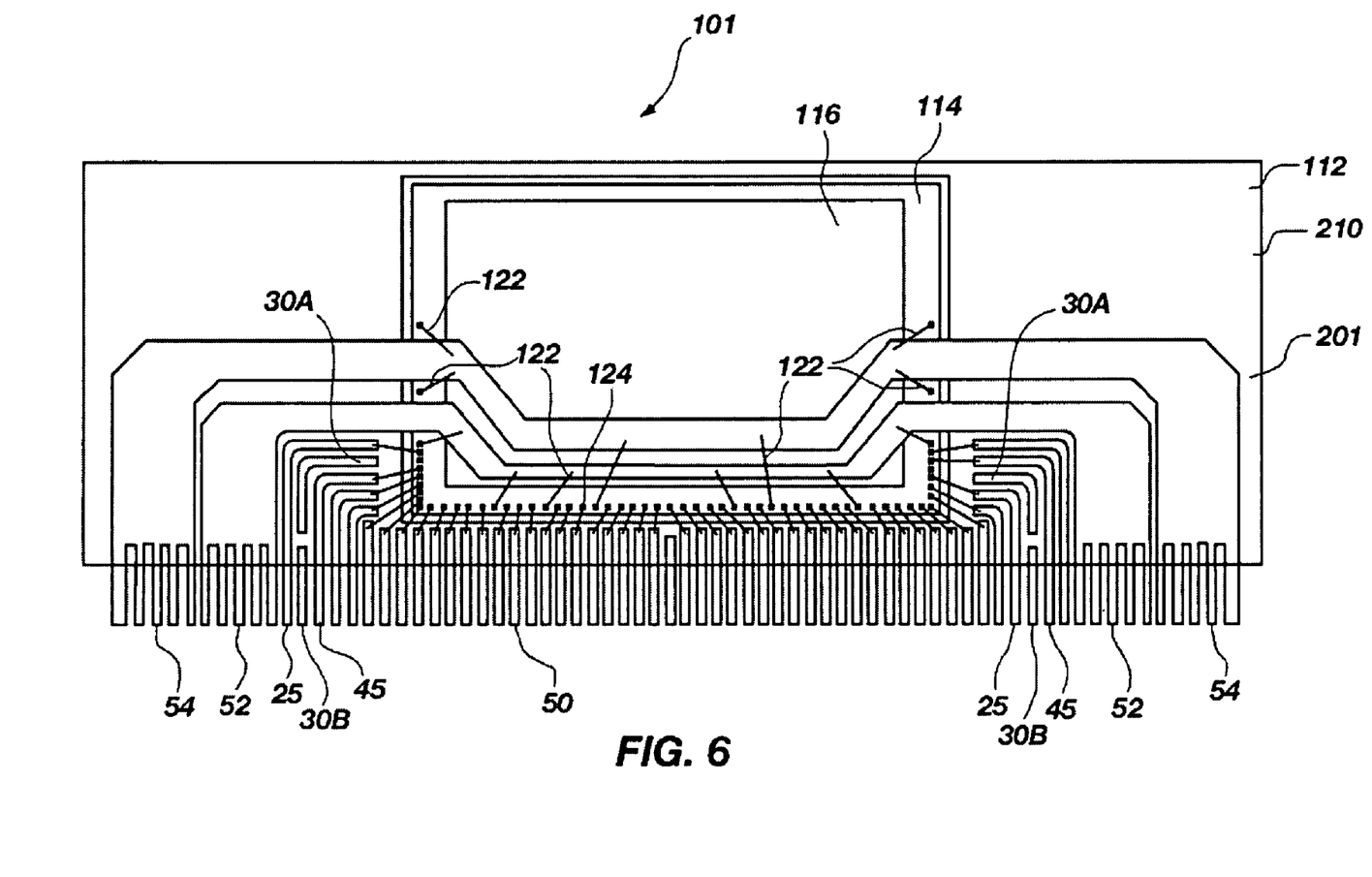
FIG. 6 is a side view of one side of a fourth embodiment of the present invention in the form of a vertical surface mount package.

Referring to drawing FIG. 6, the first side 210 of a fourth embodiment of the integrated circuit package 101 of the present invention is shown. The integrated circuit package 101 comprises a substrate 112, semiconductor device 114, tape 116, lead frame 201, and wire bond interconnections 122. As illustrated, the semiconductor device 114 is a modified Leads-Over-Chip (LOC) configuration with respect to the lead frame 201.

The substrate 112 comprises any suitable well known dielectric substrate for use with the semiconductor device 114. The semiconductor device 114 is contained or received within an aperture extending partially or completely therethrough to the other side of the substrate 112.

The semiconductor device 114 comprises any suitable type semiconductor device, such as a Dynamic Random Access Memory (DRAM) die, a Static Random Access Memory (SRAM) die, Synchronous DRAM (SDRAM) dice, a Sequential Graphics Random Access Memory (SGRAM) die, a flash Electrically Erasable Programmable Read-Only Memory (EEPROM) die, a logic die, and/or a processor die. The semiconductor device 114 includes at least a plurality of bond pads 124 on the active surface thereof.

The tape 116 comprises any suitable well known type dielectric film that may be adhesively coated to secure portions of the lead frame 201 thereto and the tape 116 to the semiconductor device 114. One suitable type tape includes KAPTON™ tape, which may be adhesively coated on both sides thereof. The tape 116 extends over any desired portion of the active surface of the semiconductor device 114 to electrically insulate the active surface from the lead frame 201. Portions of the lead frame 201 may also be secured to the semiconductor device 114 using, for example, a dielectric liquid or gel adhesive.

The lead frame 201 comprises a first plurality of discrete leads 50, a second plurality of leads 52 commonly connected over a portion of the length thereof, and a third plurality of leads 54 commonly connected over a portion thereof. The portions of the second plurality and third plurality of leads 52 and 54, respectively, are adhesively secured to the substrate 112, and to the insulating tape 116 through the use of well known suitable adhesives.

A plurality of wire bond interconnections 122 interconnects the plurality of bond pads 124 on the active surface of the semiconductor device 114 and the first 50, second 52, and third 54 pluralities of leads. The wire bond interconnections 122 are made using suitable well-known wire bonding devices.

At least two of the plurality of conductive lead fingers 50 represent any two conductive lead fingers where the signal of one can interfere with the signal of the other. A noisy lead finger 25 typically may be one most prone to causing induction noise, i.e., Vcc, Vss, DIN, DOUT, UQDS, and WE, and a sensitive lead finger 45 generally may be one most subject to induction effects, i.e., Vcc, Vss, VREF, DIN, DOUT, WE, RAS, and CAS. A floating lead finger may be located between the noisy lead finger 25 and the sensitive lead finger 45 to minimize inductive interaction.

The floating lead is an NC lead, not configured to be connected to any of the bond pads on the chip but may be adhesively secured to the substrate for support. A floating lead finger inner portion 30A is severed from electrical connection with an associated floating lead finger outer portion 30B. Thus, the floating lead finger inner portion 30A is electrically isolated and may provide isolation for the sensitive lead finger 45 from the noisy lead finger 25.

FIG. 7 depicts a partial section of lead frame 700 of a fifth embodiment of the present invention. The lead frame 700 includes a plurality of inwardly extending conductive lead fingers 750. As shown, tape 710 may be pre-applied to conductive lead fingers 750. A semiconductor device may subsequently be attached to the tape 710. At least one conductive lead finger is designated as a floating lead finger. The floating lead finger has a floating lead finger inner portion 730A having a plurality of proximal lead elements 731 and an associated distal intersection 733. The floating lead finger additionally includes an associated outer portion 730B.

In addition, it will be understood that while only one floating lead finger is shown in FIG. 7, the present invention includes within its scope lead frames with any number of floating lead fingers. Further, the present invention includes within its scope floating lead finger inner portions having any number of proximal lead elements.

FIG. 8 depicts a partial section of lead frame 800 of a sixth embodiment of the present invention. The lead frame 800 includes a plurality of inwardly extending conductive lead fingers 850. As shown, tape 810 is pre-applied to inwardly extending conductive lead fingers 850. A semiconductor device may subsequently be attached to the tape. At least one conductive lead finger is designated as a floating lead finger. The floating lead finger has a plurality of floating lead finger inner portions 830A. The floating lead finger outer portion 830B includes an intersection 832, located within the package body, generally indicated by the dashed line 200. The intersection 832 is associated with the plurality of floating lead finger inner portions 830A.

In addition, it will be understood that while only one floating lead finger is shown in FIG. 8, the present invention includes within its scope lead frames with any number of floating lead fingers. Further, the present invention includes within its scope any number of floating lead finger inner portions associated with a floating lead finger outer portion.

As will be appreciated by those of ordinary skill in the art, the present invention provides increased distance between conductive lead fingers for noise reduction and may avoid reliability problems associated with the peeling off of adhesive tape affixing a semiconductor device to conductive lead fingers.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. For example, the invention is not limited to devices having central bond pads or to a specific number or types of leads, bond pads, dice, encapsulant, etc. Furthermore, the particular lead register may differ. Additionally, the present invention is equally applicable to any die package including, by way of example and without limitations, Thin Small Outline Package (TSOP), a Thin Quad Flat Pack (TQFP), a Small Outline J-lead (SOJ) package, a Plastic Leaded Chip Carrier (PLCC), and a Dual In-line Package (DIP). The scope of the invention is, therefore, indicated and limited only by the appended claims and their legal equivalents, rather than by the foregoing description. All additions, deletions, and modifications to the invention, as disclosed herein, which fall within the meaning and scope of the claims, are to be embraced thereby.

What is claimed is:

1. A semiconductor device assembly, comprising:
   a semiconductor device having a plurality of bond pads on an active surface thereof;
   a plurality of lead fingers, at least one lead finger of the plurality of lead fingers being affixed to the active surface of the semiconductor device;
   a plurality of discrete conductive elements, each of the plurality of discrete conductive elements electrically connecting at least one of the plurality of bond pads with at least one of the plurality of lead fingers;
   at least one floating lead finger inner portion affixed to the active surface of the semiconductor device in electrical isolation therefrom; and
   at least one floating lead finger outer portion associated with the at least one floating lead finger inner portion in electrical isolation therefrom and in electrical isolation from the semiconductor device.

2. The semiconductor device assembly of claim 1, further comprising another floating lead finger inner portion affixed to the active surface of the semiconductor device in electrical isolation therefrom, and associated with the at least one floating lead finger outer portion.

3. The semiconductor device assembly of claim 1, wherein the at least one floating lead finger inner portion comprises a plurality of proximal lead elements.

4. The semiconductor device assembly of claim 1, wherein the plurality of lead fingers extend toward a center of the semiconductor device from a plurality of peripheral edges of the semiconductor device.

5. The semiconductor device assembly of claim 4, wherein the plurality of lead fingers extends toward the center of the semiconductor device from four peripheral edges of the semiconductor device.

6. The semiconductor device assembly of claim 1, wherein the plurality of lead fingers extends toward the center of the semiconductor device from a single peripheral edge of the semiconductor device.

7. The semiconductor device assembly of claim 1, wherein each of the plurality of bond pads is electrically connected with a lead finger of the plurality of lead fingers.

8. The semiconductor device assembly of claim 1, further comprising a dielectric encapsulant formed about the semiconductor device and partially about a portion of each of the plurality of lead fingers.

9. The semiconductor device assembly of claim 1, wherein at least one of the plurality of bond pads is located within a central region of the semiconductor device active surface.

10. The semiconductor device assembly of claim 1, wherein at least one of the plurality of bond pads is located within a peripheral region of the semiconductor device active surface.

11. The semiconductor device assembly of claim 1, wherein the at least one lead finger of the plurality of lead fingers is affixed to the active surface of the semiconductor device using an adhesive coated tape.

12. The semiconductor device assembly of claim 1, wherein the plurality of discrete conductive elements comprise at least one of bond wires, tape-automated bond elements, thermocompression bonds, and conductive adhesives.

13. The semiconductor device assembly of claim 1, wherein the at least one floating inner lead finger portion extends substantially perpendicularly to at least one peripheral edge of the semiconductor device.

14. The semiconductor device assembly of claim 1, wherein the at least one floating lead finger inner portion extends beyond a center of the semiconductor device from a peripheral edge of the semiconductor device.

15. A semiconductor device assembly, comprising:
a semiconductor device having a plurality of bond pads on an active surface thereof;
a lead frame having:
a first lead finger group comprising a plurality of lead fingers extending over the semiconductor device, at least some of the plurality of bond pads being electrically connected to lead fingers of the first lead finger group; and
a second lead finger group comprising at least one floating lead finger extending over the semiconductor device and, having an inner floating lead finger portion and an associated outer floating lead finger portion, the inner floating lead finger portion being electrically isolated from the semiconductor device and from the associated outer floating lead finger portion; and
an envelope of dielectric package material encapsulating the semiconductor device, outer portions of the plurality of lead fingers protruding from the envelope of dielectric package material, the associated outer floating lead finger portion protruding from the envelope of dielectric package material in electrical isolation from the semiconductor device.

16. A semiconductor device assembly, comprising:
a semiconductor device having a plurality of bond pads on an active surface thereof;
a lead frame having:
a die paddle supporting the semiconductor device;
a first lead finger group comprising a plurality of lead fingers extending adjacent the semiconductor device, at least some of the plurality of bond pads being electrically connected to lead fingers of the first lead finger group; and
a second lead finger group comprising at least one floating lead finger extending adjacent the semiconductor device and, having an inner floating lead finger portion and an associated outer floating lead finger portion, the inner floating lead finger portion being electrically isolated from the semiconductor device and from the associated outer floating lead finger portion; and
an envelope of dielectric package material encapsulating the semiconductor device, outer portions of the plurality of lead fingers protruding from the envelope of dielectric package material, the associated outer floating lead finger portion protruding from the envelope of dielectric package material in electrical isolation from the semiconductor device.

17. A lead frame comprising:
a plurality of lead frames connected to each other forming a strip, each lead frame for connection to a semiconductor device and encapsulation of portions thereof including:
a plurality of lead fingers connected to portions of the strip of lead frames;
at least one tape segment for stabilizing and interconnecting the lead fingers of a lead frame of the plurality of lead frames in strip form; and
at least one floating lead finger electrically isolated from connection to other lead fingers of the lead frame and portions of the strip of lead frames prior to the attachment of the semiconductor device thereto and encapsulation of portions thereof, the at least one floating lead finger disposed between and secured with the at least one tape segment to two of the plurality of lead fingers, the at least one floating lead finger having an outer portion in electrical isolation from an inner portion, the inner portion in electrical isolation from the two of the plurality of lead fingers.

18. The lead frame of claim 17, wherein the tape segment is affixed to a section of the inner portion of the at least one floating lead finger and a section of at least another floating lead finger.

19. The lead frame of claim 17, wherein the at least one floating lead finger comprises a plurality of inner portions associated with the outer portion.

20. The lead frame of claim 17, wherein the inner portion of the at least one floating lead finger comprises a plurality of proximal lead elements and a distal intersection of the plurality of proximal lead elements.

21. The lead frame of claim 17, wherein the inner portion of the at least one floating lead finger extends from one side of a centerline of the lead frame to another side of the centerline of the lead frame.

22. A lead frame strip prior to encapsulation, comprising:
a strip of a plurality of lead frames, each lead frame configured to have a semiconductor device attached thereto and portions thereof encapsulated, each lead frame including:
at least one lead frame including an outer frame portion bearing a plurality of inwardly extending lead fingers, at least one lead finger of the plurality of inwardly extending lead fingers having an outer lead finger portion in electrical and mechanical isolation from an associated inwardly extending inner lead finger portion and the strip of the plurality of lead frames prior to the attachment of the semiconductor device thereto and encapsulation of portions thereof; and a tape segment affixed to a portion of the plurality of inwardly extending lead fingers including at least the inner lead finger portion of the at least one lead finger.

23. The lead frame strip of claim 22, wherein the outer frame portion further bears a die paddle substantially centered therein.

24. The lead frame strip of claim 23, wherein the tape segment comprises a lead-lock tape.

25. The lead frame strip of claim 23, further comprising a semiconductor device secured to the die paddle.

26. The lead frame strip of claim 22, wherein the plurality of inwardly extending lead fingers is located on a plurality of sides of each outer frame portion.

27. The lead frame strip of claim 26, wherein the plurality of inwardly extending lead fingers is located on four sides of each outer frame portion.

28. The lead frame strip of claim 22, wherein the at least one lead finger of the plurality of inwardly extending lead fingers extends inwardly beyond a centerline of the outer frame portion.

29. A semiconductor device assembly, comprising:
a semiconductor device having a plurality of bond pads on an active surface thereof;
a lead frame having a lead finger group comprising at least one floating lead finger extending over the semiconductor device and including an inner floating lead finger portion and an associated outer floating lead finger portion, the inner floating lead finger portion being electrically isolated from the semiconductor device and from the associated outer floating lead finger portion; and
an envelope of dielectric package material encapsulating the semiconductor device, portions of the lead finger group protruding from the envelope of dielectric package material, the associated outer floating lead finger portion protruding from the envelope of dielectric package material in electrical isolation from the semiconductor device.

30. The semiconductor device assembly of claim 29, wherein the lead finger group further comprises a plurality of lead fingers extending over the semiconductor device, at least some of the plurality of bond pads being electrically connected to lead fingers of the lead finger group.

31. The semiconductor device assembly of claim 29, wherein the inner floating lead finger portion comprises a plurality of proximal lead elements.

32. The semiconductor device assembly of claim 29, wherein the at least one floating lead finger of the lead finger group is affixed to the active surface of the semiconductor device using an adhesive coated tape.

33. A semiconductor device assembly, comprising:
a semiconductor device having a plurality of bond pads on an active surface thereof;
a lead frame having:
a die paddle supporting the semiconductor device; and
a lead finger group comprising at least one floating lead finger extending adjacent the semiconductor device and having an inner floating lead finger portion and an associated outer floating lead finger portion, the inner floating lead finger portion being electrically isolated from the semiconductor device and from the associated outer floating lead finger portion; and
an envelope of dielectric package material encapsulating the semiconductor device, the associated outer floating lead finger portion protruding from the envelope of dielectric package material in electrical isolation from the semiconductor device.

34. The semiconductor device assembly of claim 33, wherein the lead finger group further comprises a plurality of lead fingers extending adjacent the semiconductor device, at least some of the plurality of bond pads being electrically connected to lead fingers of the lead finger group.

35. The semiconductor device assembly of claim 34, wherein the plurality of lead fingers include outer portions protruding from the envelope of dielectric package material.

* * * * *

UNITED STATES PATENT AND TRADEMARK OFFICE
CERTIFICATE OF CORRECTION

PATENT NO. : 7,511,364 B2 Page 1 of 1
APPLICATION NO. : 10/931775
DATED : March 31, 2009
INVENTOR(S) : Corisis It is certified that error appears in the above-identified patent and that said Letters Patent is hereby corrected as shown below:

On the Title page, in field (54), in "Title", in column 1, line 2, after "AND" insert -- A --.

In column 1, line 2, after "AND" insert -- A --.

In column 14, line 27, in Claim 17, after "the" insert -- plurality of --. (first occurrence)

Signed and Sealed this

Seventh Day of July, 2009

JOHN DOLL
*Acting Director of the United States Patent and Trademark Office*